Figure 1A:
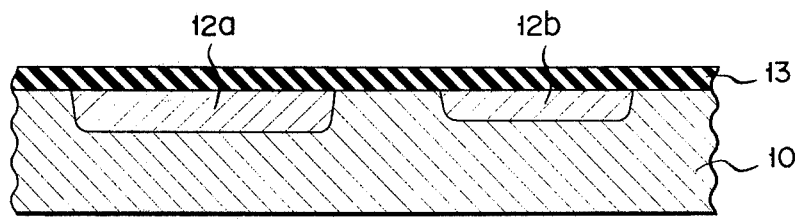

United States Patent [19]

Komatsu et al.

[11] 4,261,765

[45] Apr. 14, 1981

[54] METHOD OF MANUFACTURING A SEMICONDUCTOR DEVICE

[75] Inventors: Shigeru Komatsu, Yokohama; Shinobu Takahashi, Kitakyushu, both of Japan

[73] Assignee: Tokyo Shibaura Denki Kabushiki Kaisha, Japan

[21] Appl. No.: 84,302

[22] Filed: Oct. 12, 1979

[30] Foreign Application Priority Data

Oct. 19, 1978 [JP] Japan .................. 53-127834

[51] Int. Cl.³ .......................................... H01L 21/26
[52] U.S. Cl. ..................................... 148/1.5; 148/187; 148/188
[58] Field of Search ................. 148/187, 1.5, 188, 189

[56] References Cited

U.S. PATENT DOCUMENTS

| 3,883,889 | 5/1975 | Hall | 357/73 |
|---|---|---|---|
| 3,992,232 | 11/1976 | Kaji et al. | 148/187 |
| 4,030,952 | 6/1977 | Luce et al. | 148/187 |
| 4,043,849 | 8/1977 | Kraft et al. | 148/1.5 X |
| 4,110,125 | 8/1978 | Beyer | 148/1.5 |
| 4,123,564 | 10/1978 | Ajima et al. | 148/187 X |
| 4,139,402 | 2/1979 | Steinmaier et al. | 148/1.5 X |

Primary Examiner—G. Ozaki
Attorney, Agent, or Firm—Finnegan, Henderson, Farabow, Garrett & Dunner

[57] ABSTRACT

A method of manufacturing a semiconductor device, which comprises the steps of depositing an electric insulation layer on the surface of a semiconductor substrate in which a deeper base region and a shallower base region are diffused; forming in the electric insulation layer an opening for diffusing an emitter region in the deeper base region; coating the shallower base region with a covering layer in which oxygen and an oxygen compound are diffused at a smaller constant than in the electric insulation layer; carrying out heat treatment in an oxidizing atmosphere to diffuse an emitter region in the deeper base region and also to deposit an oxide layer on these portions of the main surface of the substrate which are not coated with the covering layer; and diffusing an emitter region in the shallower base region, and whereby the current-amplifying properties of the respective transistors whose base and emitter regions are diffused with different depths can be easily controlled with high precision.

10 Claims, 13 Drawing Figures

F I G. 1E
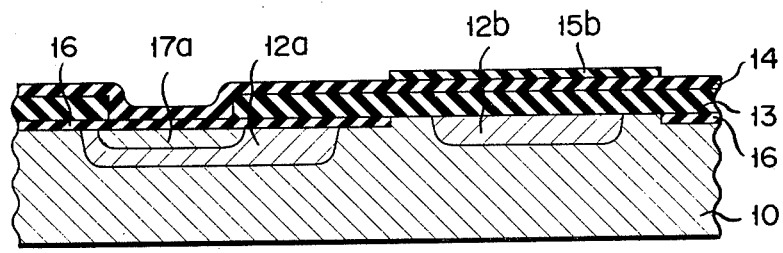
F I G. 1F
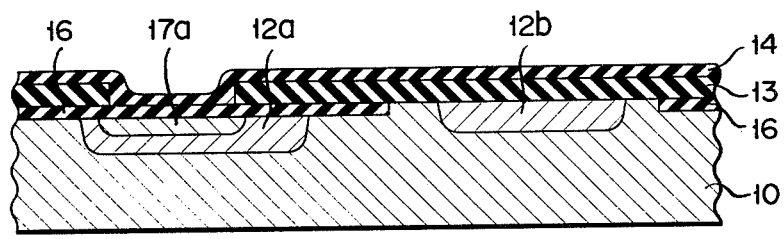
F I G. 1G
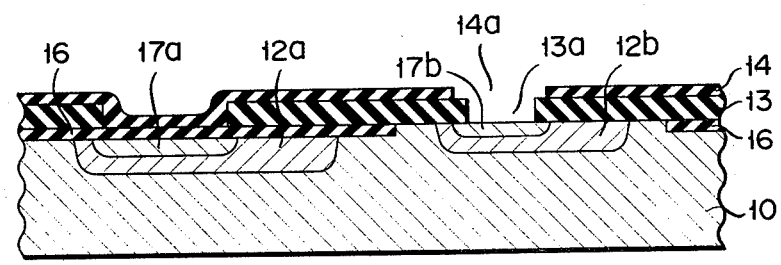

F I G. 2A
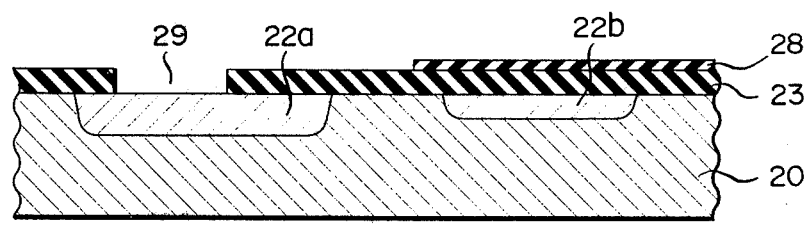
F I G. 2B
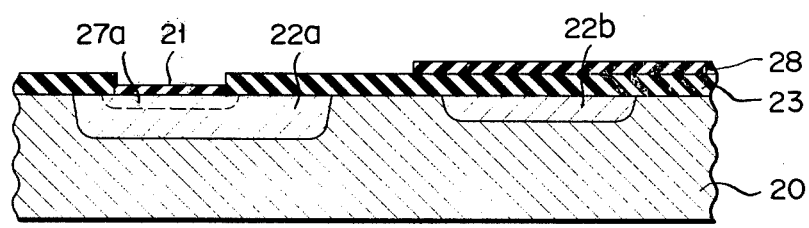
F I G. 2C
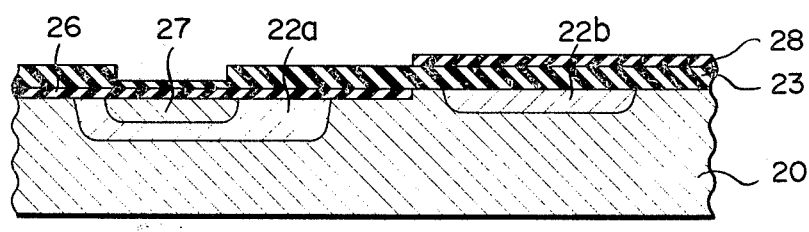

METHOD OF MANUFACTURING A SEMICONDUCTOR DEVICE

This invention relates to a method of manufacturing a semiconductor device, and more particularly to a method of manufacturing a semiconductor device comprising a plurality of transistors whose base regions are diffused with different depths.

Generally, the base region of a transistor used as a semiconductor device is so formed as to indicate properties conforming to the frequency at which the transistor is operated. If, in case two transistors constituting a single semiconductor device are operated at widely different frequencies, their base regions are diffused in a substrate with the same depth, then the following difficulties arise;

(1) Where all the transistors jointly constituting a single semiconductor device are of the high frequency type, and consequently their base regions have only to be diffused with a small depth, then parasitic oscillations are likely to arise in the low frequency circuit of the semiconductor device. If formed under such condition, therefore, a power transistor will have a low area of safety operation due to the above-mentioned small diffusion depth of the base region.

(2) Where all the transistors jointly constituting a single semiconductor device are of the low frequency type, and consequently then base regions are diffused with a great depth, then the low frequency at which the transistors are operated fails to ensure the stable operation of that section of a semiconductor device (for example, an oscillation circuit), for which a prominent high frequency property is demanded.

To eliminate the above-mentioned drawbacks, it is necessary to form a plurality of transistors in one substrate by varying the depth with which their base and emitter regions are diffused in accordance with the frequency at which the transistors are to be operated. However, the following difficulties arise in forming in the same substrate a transistor whose base region is diffused with a greater depth and a transistor whose base region is diffused with a smaller depth.

To begin with, it is necessary to diffuse a transistor emitter with a greater depth, before diffusing a transistor emitter with a smaller depth. If an oxidizing atmosphere is applied in diffusing a transistor emitter with a greater depth, then wide changes will undesirably occur in the concentration profile of an impurity constituting a shallow base region. Further, heat treatment applied in diffusing a transistor base region with a smaller depth will noticeably change the properties of a transistor whose base region is diffused with a greater depth. Therefore, it is necessary to control beforehand the current-amplifying rate of a transistor whose base and emitter regions are diffused with a greater depth in anticipation of possible changes in said current-amplifying rate which will probably result from heat treatment applied in forming an emitter region in the base region of another transistor which is diffused with a smaller depth.

As mentioned above, the process of forming in one substrate a transistor whose base and emitter regions are diffused with a smaller depth and another transistor whose base and emitter regions are diffused with a greater depth and causing these transistors respectively to indicate a desired current amplifying property is very much complicated. Accordingly, the reproducibility of these transistors are rendered unstable, resulting in a decrease in the yield. In recent years, however, it is demanded to integrate a semiconductor device with a greater density and consequently produce a plurality of circuits which are to be operated at different frequencies in the form of a single semiconductor device.

It is accordingly an object of this invention to provide a method of manufacturing a semiconductor device in which a transistor whose base and emitter regions are diffused with a greater depth and another transistor whose base and emitter regions are diffused with a smaller depth are formed in one substrate, and more particularly a process capable of precisely controlling the current-amplifying rate of a transistor whose base and emitter regions are diffused with a greater depth, a process which has hitherto been accompanied with great complications.

To this end, this invention provides a method of manufacturing a semiconductor device, which comprises the steps of:

(a) depositing an electric insulation layer on the main surface of a substrate in which at least one transistor base region is diffused with a greater depth and at least another transistor base region is diffused with a smaller depth and forming an emitter diffusing opening in that portion of said electric insulation layer which lies on the deeper base region;

(b) covering the shallower base region with a covering layer in which oxygen and an oxygen compound are diffused at a smaller constant than in the electric insulation layer;

(c) diffusing an emitter-forming impurity in the deeper base region through the emitter diffusion opening in an oxidizing atmosphere, and thermally depositing an oxide layer on that portion of the main surface of the substrate which is not coated with said covering layer; and (d) partly etching the covering layer and diffusing an emitter region in the shallower base region through the etched portion of said covering layer.

The covering layer should preferably be formed of silicon nitride, silicon carbide, polycrystalline silicon, or a metal stable at high temperature such as molybdenum and tungsten.

Figure 3A:
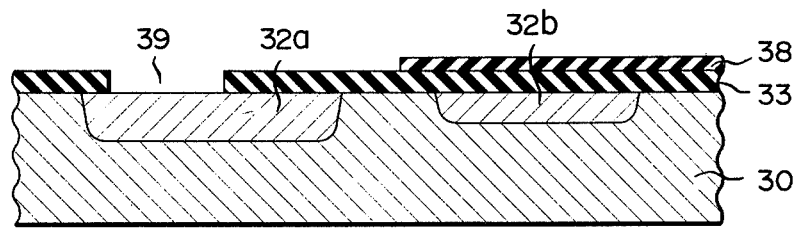
Figure 3B:
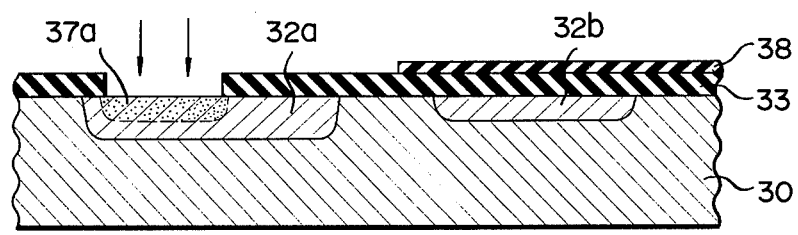
Figure 3C:
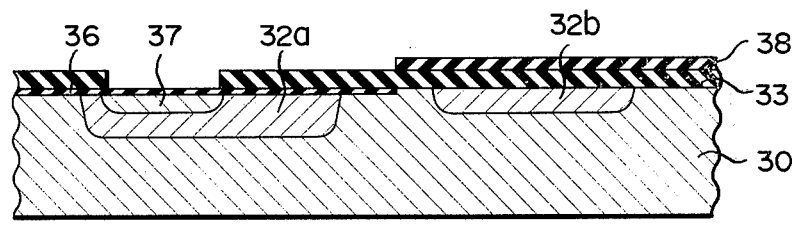

This invention can be more fully understood from the following detailed description when taken in conjunction with the accompanying drawings, in which:

FIGS. 1A to 1G schematically illustrate the sequential steps of manufacturing a semiconductor device according to one embodiment of this invention which includes the step of utilizing doped silicate glass to form an emitter region in a deeper base region;

FIGS. 2A to 2C schematically show the sequential steps of manufacturing a semiconductor device according to another embodiment of the invention which includes the step of utilizing an impurity deposition to form an emitter region in the deeper base region; and FIGS. 3A to 3C schematically indicate the sequential steps of manufacturing a semiconductor device according to still another embodiment of the invention which includes the step of applying ion implantation to diffuse an emitter region in the deeper base region.

There will now be described by reference to FIGS. 1A to 1G the method of manufacturing a semiconductor device according to one embodiment of this invention.

Figure 1B:
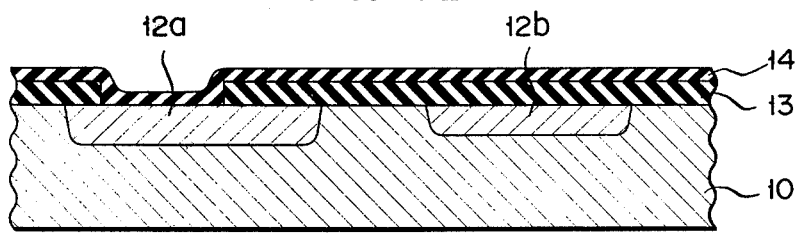

Referring to FIG. 1A, a first or deeper base region 12a and second or shallower base region 12b are diffused by the customary process in a semiconductor substrate of, for example, silicon. Though not shown, a region including the shallower base region may be isolated from each other by a P-N junction. The openings through which these deeper and shallower base regions are to be diffused are covered with an electric insulation layer 13 of, for example, $SiO_2$ which is deposited all over the main surface of the substrate. The $SiO_2$ electric insulation layer 13 is selectively etched to form an opening in the upper portion of the deeper base region 12a to diffuse a first emitter region in said deeper base region 12a. Referring to FIG. 1B, a doped silicate glass layer 14 is deposited all over the main surface of the substrate 10. This doped silicate glass layer 14 is brought into contact with the substrate 10 in the deeper base region 12a through said opening. Therefore, the doped silicate glass layer 14 has only to be formed above said opening. The doped silicate glass contains a high concentration of an N type impurity such as phosphorus or arsenic, where both first and second base regions 12a, 12b are of the P type. The doped silicate glass layer 14 may be deposited by the customary process. However, it is preferred that said glass layer 14 be deposited by vapor phase growth at a low temperature of about 500° C. in a gas mixture consisting of $SiH_4$, $PH_3$ or $AsH_3$, and $O_2$. Where, if necessary, a getter layer (not shown) is later formed on the doped silicate glass layer 14 at a temperature of 950° to 1050° C. to absorb alkali ions remaining in the $SiO_2$ layer 13, doped silicate glass layer 14, and an interface between the $SiO_2$ layer 13 and substrate 10, then it is possible to suppress 1/f noise appearing in a low frequency region. Obviously, the getter layer has to be later etched off by a dilute solution of a fluoric acid.

Figure 1C:
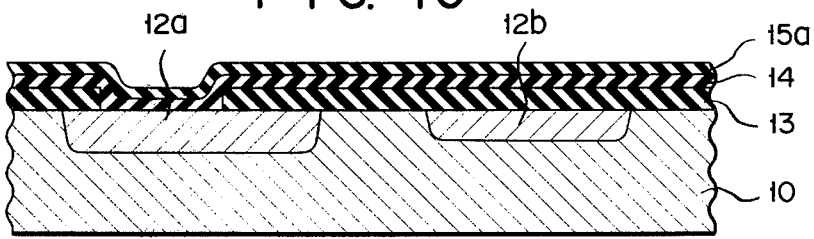
Figure 1D:
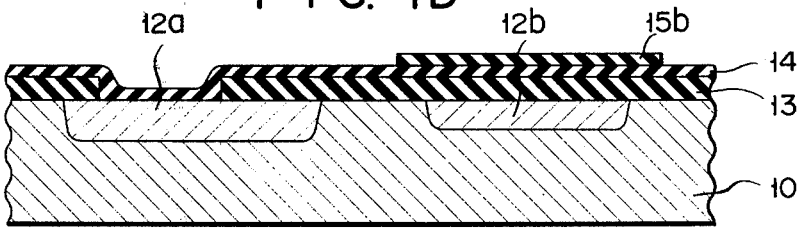

Referring to FIG. 1C, a layer 15a in which oxygen and an oxygen compound are diffused at a smaller constant than in the electric insulation layer 13 is deposited by the customary process all over the doped silicate glass layer 14. The layer 15a is selectively etched with a layer 15b retained to cover at least the shallower base region 12b as shown in FIG. 1D. If the covering layer 15b is deposited to cover the other portions of the main surface of the substrate 10 than that in which the deeper base region 12a is diffused, then it is possible to protect, for example, a base resistance region, which should be saved from changes in the sheet resistance. The covering layer 15b prevents the main surface of the substrate 10 from being oxidized during the subsequent step of diffusing an emitter region in the deeper base region due to oxygen and steam passing through the doped silicate glass layer 14 and electric insulation layer 13. If prepared from silicon nitride or silicon carbide, the covering layer 15b fully attains the above-mentioned object of protection with a thickness of about 1000 Å at most, because the above-mentioned silicon nitride or silicon carbide is little likely to be decomposed into silicon dioxide even in an oxidizing atmosphere. If formed of polycrystalline silicon, molybdenum or tungsten, the covering layer 15b should be deposited with a sufficiently great thickness (for example, at least about 3000 Å) to be saved from thorough oxidation, because said polycrystalline silicon, molybdenum and tungsten are more readily oxidized than silicon nitride or carbon nitride.

Referring to FIG. 1E, a first emitter region 17a is thermally diffused in the deeper base region 12a in an oxidizing atmosphere. Heat treatment in this case is generally carried out 15 to 30 minutes at a temperature of 1050° to 1100° C., where, for example, an N type impurity is diffused. The step of FIG. 1E causes an emitter-forming impurity to be diffused in the deeper base region 12a from the doped silicate glass layer 14 through the aforesaid opening to form an emitter region 17a. The rate of current amplification by a transistor thus produced is controlled to 100 to 200. The above-mentioned heat treatment is carried out in an oxidizing atmosphere, for example, a gaseous mixture which consists of nitrogen and oxygen, and contains steam. As a result, an oxide film 16 is thermally formed, as shown in FIG. 1E, between the $SiO_2$ electric insulation layer 13 and substrate 10. With the foregoing embodiment, the thermally produced oxide film 16 is formed of $SiO_2$ and generally has a thickness ranging between scores of Å units and several hundred Å unit depending on the conditions of the aforesaid heat treatment. The oxide film 16 is formed only in those portions of the intervening area between the $SiO_2$ electric insulation layer 13 and substrate 10 which are not closed with the covering layer 15b. The reason for this is that the covering layer 15b prevents oxygen and an oxygen compound from being carried into those portions which are covered with said covering layer 15b.

After the diffusion of the emitter region 17a in the deeper base region 12a is brought to an end, the covering layer 15b is selectively etched off by the customary process as shown in FIG. 1F. With the above-mentioned embodiment of FIG. 1F, the covering layer 15b was all etched off. However, it is possible to etch off only that portion of said covering layer 15b which should be removed to provide an opening for the subsequent diffusion of an emitter region in the shallower base region 12b. Referring to FIG. 1G, an emitter diffusion opening is formed by the customary process throughout the electric insulation layer 13 and doped silicate glass layer 14 both mounted on the shallower base region 12b. As shown in FIG. 1G, said emitter diffusion opening may consist of a smaller diameter opening 13a formed in the $SiO_2$ electric insulation layer 13 and a larger diameter opening formed in the doped silicate glass layer 14. Further, the openings of both layers 13, 14 may be simultaneously formed with the same diameter. Last, as shown in FIG. 1G, an emitter-forming impurity is diffused in the shallower base region 12b by the customary process to form a second emitter region 17b. The second emitter region 17b which is formed in the shallower base region 12b should preferably be diffused at a lower temperature, for example 900° to 1000 °C., than when the first emitter region 17a is diffused in the deeper base region 12a. Where the shallower base region 12b has a depth of about 1.2 microns, it is advised to diffuse the second emitter region 17b at temperature of about 950 °C. for about 30 minutes in an oxidizing atmosphere free from steam. This process controls the rate of current amplification by the resultant transistor to 100.

There will now be described by reference to FIG. 2A to 2C a method of manufacturing a semiconductor device according to a second embodiment of this invention. With this embodiment, the first emitter region is formed by deposition of an impurity based on a gas phase-solid phase reaction, followed by emitter slumping.

As in the first embodiment, there is provided a substrate 20, which comprises a deeper base region 22a and a shallower base region 22b, and whose main surface is covered with a $SiO_2$ electric insulating layer 23. Referring to FIG. 2A, an emitter diffusion opening 29 is formed by the customary process in the SiO$_2$ electric insulating layer 23 to diffuse a first emitter region in the deeper base region 22a. Thereafter a Si$_3$N$_4$ layer 28 is formed to cover a shallower base region 22b. Then, an emitter-forming impurity is deposited by a solid phase-gas phase reaction. Where, for example oxygen and oxyphosphorus chloride (POCl$_3$) are applied a phosphorus glass layer 21 and a phosphorus deposition layer 27a are formed as shown in FIG. 2B. Where heat treatment is applied in an atmosphere containing steam, then the impurity is diffused in the deeper base region 22a to form a first emitter region 27. At this time, an oxide layer 26 is thermally formed, as shown in FIG. 2C, on that portion of the surface of the substrate 20 which is not protected by the Si$_3$N$_4$ layer 28. This oxide layer 26 covers the deeper base region 22a and the first emitter region 27 formed therein.

There will now be described by reference to FIGS. 3A to 3C a method of manufacturing a semiconductor device according to a third embodiment of this invention. According to this embodiment, the first emitter region is diffused by ion implantation followed by emitter slumping.

A substrate 30 is provided which comprises a deeper base region 32a and shallower base region 32b, and whose main surface is covered with a SiO$_2$ electric insulating layer 33. Referring to FIG. 3A, an emitter diffusion opening 39 is formed in the SiO$_2$ electric insulating layer 33 to diffuse a first emitter region in the deeper base region 32a. Thereafter, a Si$_3$N$_4$ layer 38 is deposited on the SiO$_2$ electric insulation layer 33 to cover a shallower base region 32b. Then an emitter-forming impurity, for example, phosphorus is diffused by the customary ion implantation process in the deeper base region 32a through the opening 39 to provide an ion implantation layer 37a, as shown in FIG. 3B. Heat treatment in an oxidizing atmosphere containing steam causes an emitter region 37 to be formed in the deeper base region 32a. At this time, an oxide layer 36 is formed, as shown in FIG. 3C, on that portion of the surface of the substrate 30 which is not protected by the Si$_3$N$_4$ layer 38. The oxide layer 36 covers the deeper base region 32a and emitter region 37.

Where a semiconductor is manufactured whose substrate contains a plurality of transistors having the base regions diffused with different depths, the method of this invention precisely controls the rate of current amplification of the first transistor whose base region is diffused beforehand with a greater depth, without the necessity of anticipating possible changes in said current amplification rate which might result from the heat treatment later applied when forming an emitter region in the base region of the second transistor which is diffused with a smaller depth. The reason for this is as follows. Since an emitter region is first diffused in the deeper base region of the first transistor and at the same time an oxide layer is thermally formed to cover said deeper base region, this oxide layer prevents an emitter diffusion impurity from being further diffused in said deeper base region or the emitter diffusion impurity already diffused in said deeper base region from being diffused to a far deeper depth during the subsequent heat treatment applied in diffusing an emitter region in the shallower base region of the second transistor. Even where said heat treatment was applied for one hour at a temperature of 1050° C. in an oxidizing atmosphere free from steam, the rate of current amplification by the first transistor whose base was diffused beforehand with a greater depth according to this invention was not substantially effected by the above-mentioned heat treatment. In other words, only smaller changes than 10% occurred in said rate of current amplification. In contrast, where an emitter region was diffused in the deeper base region of the first transistor in an inert atmosphere, no oxide layer was formed at all. Where, therefore, heat treatment was later applied for 30 minutes at a temperature of 950° C. in an oxidizing atmosphere free from steam, the rate of current amplification by the first transistor indicated as large variations as 200 to 400%.

Where an emitter region is diffused in an oxidizing atmosphere according to the method of this invention, a base impurity is carried into the resultant oxide layer. The base impurity particularly of the shallow base region indicates noticeable changes in the concentration profile in the proximity of the surface of a substrate. According to the method of the invention, however, the other portions of the surface of the substrate than that in which a deeper base region is diffused, particularly those portions of the surface of the substrate in which a shallower base region is diffused is covered with an antioxidizing layer. Consequently, no oxide layer is deposited at least on the shallower base region. Even where, therefore, an emitter region in diffused in an oxidizing atmosphere, the impurity of the shallower base region and that of a resistor formed together until the base region provided in case of need indicate little change in the concentration profile.

As described above, the method of this invention provides a semiconductor device by a very simple process in which the current-amplifying property of a transistor whose base and emitter regions are diffused with a greater depth and that of a transistor whose base and emitter regions are diffused with a smaller depth can be precisely controlled.

It will be noted that this invention is not restricted to the aforesaid embodiments, but includes various modifications which may be easily undertaken by those skilled in the art.

What we claim is:

1. A method of manufacturing a semiconductor device in which a transistor whose base and emitter regions are diffused with a greater depth and a transistor whose base and emitter regions are diffused with a smaller depth are formed in a single substrate, comprising the steps of:
    (a) depositing an insulation layer on the main surface of a substrate in which at least one transistor base region is diffused with a greater depth and at least another transistor base region is diffused with a smaller depth and forming in said insulation layer an opening through which an emitter region can be subsequently diffused in the deeper base region;
    (b) forming a covering layer in which oxygen and an oxygen compound are diffused at a smaller constant than in the insulation layer to cover at least the shallower base region and at most the other portions of the main surface of the substrate than that in which the deeper base region is diffused;
    (c) diffusing an emitter-forming impurity in the deeper base region through the emitter diffusion opening by carrying out heat treatment in an oxidizing atmosphere and thermally depositing an oxide layer on that portion of the main surface of the substrate which is not coated with the covering layer; and (d) etching off at least one portion of the covering layer and diffusing an emitter region in the shallower base region through said etched portion.

2. The method of manufacturing a semiconductor device according to claim 1, wherein the covering layer is formed of one material selected from the group consisting of silicon nitride, silicon carbide, polycrystalline silicon, molybdenum and tungsten.

3. The method of manufacturing a semiconductor device according to claim 2, wherein, when formed of silicon nitride or silicon carbide, the covering layer is chosen to have a thickness of about 1000Å at most.

4. The method of manufacturing a semiconductor device according to claim 2, wherein, when prepared from polycrystalline solution, molybdenum or tungsten, the covering layer is chosen to have a greater thickness than at least about 3000Å.

5. The method of manufacturing a semiconductor device according to claim 1, which comprises the steps of forming in the insulation layer an opening through which an emitter region is diffused in the deeper base region; depositing all over the surface a doped silicate glass layer including an emitter-forming impurity; and carrying out heat treatment in an oxidizing atmosphere after the deposition of the covering layer.

6. The method of manufacturing a semiconductor device according to claim 1, which comprises the steps of depositing by a gas phase-solid phase reaction an emitter-forming impurity after forming the covering layer; and carrying out heat treatment in an oxidizing atmosphere.

7. The method of manufacturing a semiconductor device according to claim 1, which comprises the steps of carrying out the ion implantation of an emitter-forming impurity after the deposition of the covering layer; and carrying out heat treatment in an oxidizing atmosphere.

8. The method of manufacturing a semiconductor device according to any of the claims 1, 5, 6 or 7, wherein the oxidizing atmosphere is a gas mixture which consists of oxygen and nitrogen and contains steam.

9. The method of manufacturing a semiconductor device according to claim 1, wherein heat treatment for diffusing an emitter-forming impurity in the shallower base region is carried out at a lower temperature than that at which heat treatment is undertaken to diffuse an emitter-forming impurity in the deeper base region.

10. The method of manufacturing a semiconductor device according to claim 1 or 9, wherein heat treatment for diffusing an emitter-forming impurity in the deeper base region is carried out at a temperature of 1050° to 1100° C. in an oxidizing atmosphere containing steam; and heat treatment for diffusing an emitter-forming impurity in the shallower base region is conducted at a temperature of 900° to 1000° C. in an oxidizing atmosphere free from steam.

* * * * *